United States Patent
Werni

(10) Patent No.: US 6,700,768 B2
(45) Date of Patent: Mar. 2, 2004

(54) FUSE HOUSING

(75) Inventor: Horst Werni, Munich (DE)

(73) Assignee: Patent-Treuhand-Gesellschaft fur elektrische Gluhlampen mbH, Munich (DE)

(*) Notice: Subject to any disclaimer, the term of this patent is extended or adjusted under 35 U.S.C. 154(b) by 0 days.

(21) Appl. No.: 10/271,725

(22) Filed: Oct. 17, 2002

(65) Prior Publication Data

US 2003/0086232 A1 May 8, 2003

(30) Foreign Application Priority Data

Nov. 5, 2001 (DE) ......................................... 101 53 814

(51) Int. Cl.⁷ ............................................... H02H 5/00
(52) U.S. Cl. ......................... 361/103; 361/58; 361/104
(58) Field of Search ......................... 361/103, 58, 124, 361/104, 39

(56) References Cited

U.S. PATENT DOCUMENTS 3,778,740 A * 12/1973 Gaia et al.
4,689,597 A * 8/1987 Galloway et al.
5,936,507 A * 8/1999 Borck et al.

FOREIGN PATENT DOCUMENTS

DE        37 23 832        2/1989    ............ H05K/1/16

* cited by examiner

*Primary Examiner*—Stephen W. Jackson

(57) ABSTRACT

The invention relates to a cost effective protective device for safeguarding an electrical device against overcurrent. The preferred exemplary embodiment is a conductor track fuse that is arranged in a hollow body. According to the invention, the hollow body has an opening that specifically allows metal vapor to escape upon tripping of the fuse. This prevents the production of an electric arc.

6 Claims, 1 Drawing Sheet

FUSE HOUSING

TECHNICAL FIELD

The invention proceeds from the protective device for electrical devices in accordance with the preamble of claim 1. In particular, it relates to a cost effective safeguarding against overcurrent, that, because of its design features, does not have the risk of the formation of an electric arc by metal parts vaporized when the protective device responds.

BACKGROUND ART

If the operating voltage for an electrical device is drawn from a supply voltage, operating voltage supply leads to this device must be protected against overcurrent in accordance with relevant standards (e.g. EN60928 in the case of lighting engineering). For this reason, the electrical device must include a protective device that monitors the operating current that the electrical device draws from the supply voltage. In the event of a fault, when the operating current reaches a value that exceeds the given threshold and is therefore classified as overcurrent, the protective device responds, that is to say it interrupts the supply of power from the supply voltage to the electrical device.

It is customary to use a fusible link as protective device. In this case, a fuse wire via which the operating current is guided runs in a glass tube. In the event of overcurrent, the fuse wire fuses and interrupts the operating current. In the case of electrical devices that can be classified in a low price category, the use of a fusible link signifies a substantial rise in cost. Consequently, an attempt is made in the case of these devices to use an alternative to the fusible link, particularly whenever no repair of the electrical device after a fault is provided. Electrically conducting elements that fuse when the overcurrent is reached are used. These elements can be, for example, resistors or reactors through which the operating current flows and which can undertake still further functions apart from that of protective device.

So called conductor track fuses are widely used as substitute for a fusible link. Use is made in this case of an existing printed circuit board to which conductor tracks are applied. As a rule, two operating voltage supply leads are fed to the electrical device, each being connected to one conductor track each. A first and a second operating voltage potential surface are thereby formed as said conductor tracks. For example, the first operating voltage potential surface is split into two in order to be able to insert the electrically conducting element via which the operating current leads. In the case of the conductor track fuse, the electrically conducting element is designed as a thin piece of conductor track that is constructed to fuse in the event of overcurrent.

The following problem occurs in the case of the protective devices mentioned, which replace the fusible link, but in particular in the case of the conductor track fuse: when the fuse responds, metal vapor is formed which spreads out over the first and the second operating voltage potential surface. This can lead to the formation of an electric arc between two operating voltage potential surfaces. In the best case, this entails tripping, contrary to the standard, of fuses connected upstream of the electrical device. In the worst case, a fire is caused thereby.

In order to avoid the above-named electric arc, it is proposed in document DE 37 23 832 to provide the conductor track fuse with a covering varnish. It is also known to encapsulate the conductor track fuse in a closed hollow body formed by bounding walls. The aim is thereby to prevent the above-named metal vapor from spreading. In this case, of course, it is necessary for the second operating voltage potential surface to be situated outside the hollow body. However, upon fusing of the above-named electrically conducting element so much energy can be released that the means mentioned are insufficient to prevent the formation of an electric arc between the operating voltage potential surfaces. In particular, it can occur that the above-named hollow body does not resist the pressure produced when the protective device responds, and metal vapor escapes.

DISCLOSURE OF THE INVENTION

It is an object of the present invention to provide a cost effective protective device in accordance with the preamble of claim 1 that reliably interrupts the operating current in the event of overcurrent.

This object is achieved by means of a protective device having the features of the preamble of claim 1 owing to the features of the characterizing part of claim 1. Particularly advantageous refinements are to be found in the dependent claims.

The starting point of the protective device according to the invention is a protective device having an electrically conducting element that comes to lie in a hollow body. However, the hollow body according to the invention is not closed, rather it has an opening. The opening is dimensioned in this case such that the pressure that builds up in the hollow body when the fuse responds becomes only so large that the metal vapor produced substantially escapes through the opening according to the invention. Uncontrolled spreading of the metal vapor through leaks in the hollow body is thereby avoided.

In addition to the presence of an opening according to the invention, the arrangement of the opening is important. According to the invention, the opening is arranged at a point on the hollow body that prevents spreading of metal vapor in the direction of the second operating voltage potential surface. The direction in space in accordance with the invention in which the opening in the hollow body points therefore differs from the direction in space in which, seen from the hollow body, the second operating voltage potential surface is situated. In the case of the response of the protective device, the metal vapor produced is therefore directed specifically in one direction in the present invention. This direction is selected such that the production of an electric arc between the operating voltage potential surfaces is avoided.

The invention is advantageously applied in conjunction with the described conductor track fuse. The conductor track fuse requires no additional electrically conducting element, and is therefore particularly cost effective.

The hollow body is preferably constructed with the aid of bounding walls that are included in any case in the electrical device, or can be produced with no effect on cost. One bounding wall of the hollow body is preferably formed by the printed circuit board.

The housing of the electrical device mostly comprises the injection-molded parts. The latter can be configured without effecting costs such that they have walls that can serve as bounding walls of the hollow body. The hollow body can thus be bounded on one side by the printed circuit board and on the remaining sides by parts of the housing of the electrical device. The bounding walls that are formed by housing parts are preferably configured so as to produce an opening according to the invention in the hollow body.

Electronic operating devices for electric lamps are subject to a large pressure of cost. An attempt is therefore made to implement the above-described protective device as cost effectively as possible. For this reason, a protective device according to the invention is preferably used for electronic operating devices.

BRIEF DESCRIPTION OF THE DRAWINGS

The invention is to be explained in more detail below with the aid of an exemplary embodiment. In the drawing.

BEST MODE FOR CARRYING OUT THE INVENTION

Figure 1:
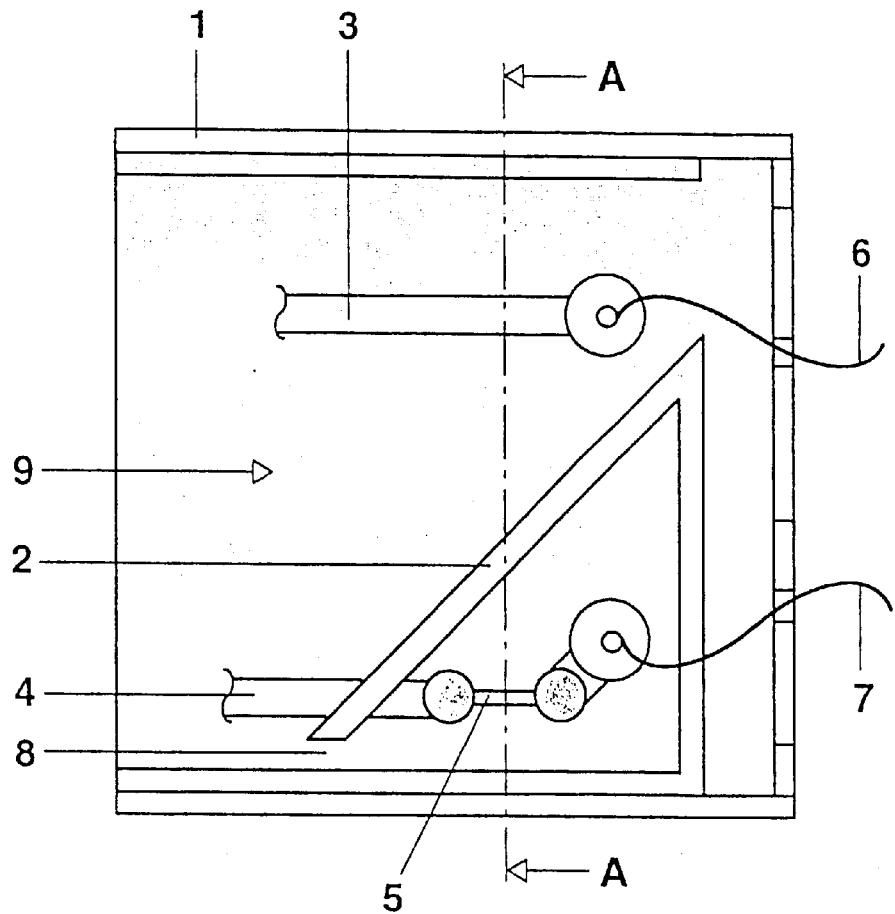
FIG. 1 shows a plan view of an electrical device.

FIG. 1 illustrates the plan view of the part of an electrical device to which the operating voltage supply leads are fed. The electrical device can be, for example, an electronic ballast for electric lamps. A printed circuit board 9 is placed in a housing part 1 that preferably consists of plastic (for example polycarbonate, ABS). It rests on a web 2, a hollow body thereby being produced whose bounding walls are formed by the printed circuit board 9, the housing part 1 and the web 2. Operating voltage supply leads 6, 7 are connected to conductor tracks 3, 4 that are applied to the printed circuit board 9. The conductor track 4 thereby forms a first operating voltage potential surface, and the conductor track 3 forms a second one. The conductor track 4 is split into two. The operating voltage supply lead 7 is connected to a first part of the conductor track 4. The first part is connected to a second part via the conductor track fuse 5. The conductor track fuse 5 is an electrically conducting element that is produced by a tapering of the conductor track 4. The tapering is dimensioned such that the conductor track fuse 5 fuses in the case of overcurrent. It is clearly to be seen that the second operating voltage potential surface, which is formed by the conductor track 3, does not come to lie in the said hollow body.

According to the invention, the said hollow body is not closed, but has an opening 8. This is produced by a cutout approximately 1 mm wide in the web 2. If the conductor track fuse 5 responds, the metal vapor produced escapes via the opening 8 from the hollow body. According to the invention, the opening 8 is dimensioned to be so large that pressure in the hollow body is insufficient to permit metal vapor to escape between the printed circuit board 9 and the web 2. The direction in space in which the metal vapor escapes upon response of the conductor track fuse is selected according to the invention by the position of the opening 8 in such a way that it differs from the direction in space in which the second operating voltage potential surface, formed by the conductor track 4, is situated. Consequently, the metal vapor cannot be positioned over two operating voltage potential surfaces and cause an electric arc.

Figure 2:
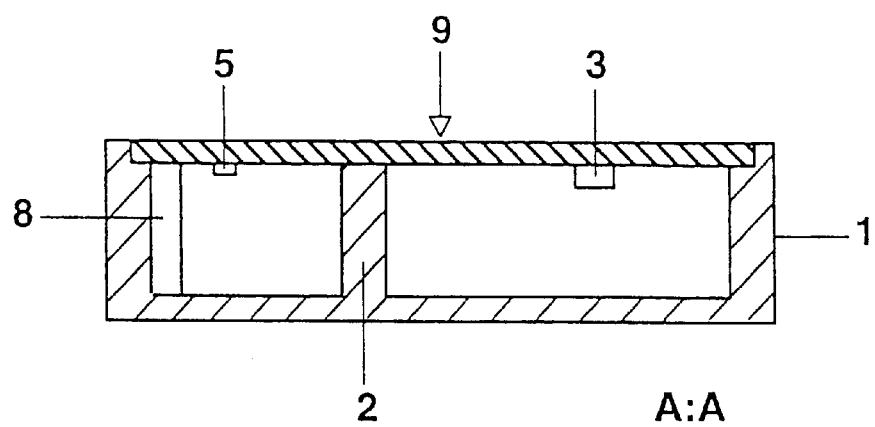
FIG. 2 shows a side view of an electrical device (Section A—A of FIG. 1).

A section A—A of FIG. 1 is illustrated in FIG. 2. Identical objects are denoted in both figures by identical reference symbols. It can clearly be seen how the printed circuit board 9 rests on the housing part 1. The web 2, which is injection molded onto the housing part 1, forms a bounding wall of the hollow body that has the opening 8 according to the invention. The conductor track fuse 5 is surrounded by the hollow body, while the second operating voltage potential surface is situated outside the hollow body.

What is claimed is:

1. A protective device for safeguarding an electrical device against overcurrent, having the following features:

an electrically conducting element (5) that fuses when the overcurrent is reached, a first (4) and a second operating voltage potential surface (3), which are connected in each case to an operating voltage supply lead (6, 7), the first operating voltage potential surface (4) is split into two, the two parts being connected by the electrically conducting element (5), and bounding walls that form a hollow body, the electrically conducting element (5) being situated inside, and the second operating voltage potential surface (3) being situated outside the hollow body, characterized in that the hollow body comprises the following features:

an opening (8) that is at least so large that, in the event of tripping, metal vapor exits substantially through this opening (8), the opening points in a direction in space that differs from the direction in space in which the second operating voltage potential surface (3) is situated.

2. The protective device as claimed in claim 1, characterized in that the electrical device is an electronic operating device for electric lamps.

3. The protective device as claimed in claim 1, characterized in that the electrically conducting element (5) is formed by a conductor track that is applied to a printed circuit board (9).

4. The protective device as claimed in claim 1, characterized in that a bounding wall of the hollow body is formed by a printed circuit board.

5. The protective device as claimed in claim 1, characterized in that a bounding wall of the hollow body is formed by a housing part (1) of the electrical device.

6. The protective device as claimed in claim 1, characterized in that the opening (8) of the hollow body is formed by a cutout in the housing part of the electrical device.

* * * * *